United States Patent
Huang

[11] Patent Number: 5,963,839
[45] Date of Patent: *Oct. 5, 1999

[54] REDUCTION OF POLYSILICON CONTACT RESISTANCE BY NITROGEN IMPLANTATION

[75] Inventor: Jenn-Ming Huang, Hsin-Chu, Taiwan

[73] Assignee: Taiwan Semiconductor Manufacturing Company, Ltd., Hsin-Chu, Taiwan

[21] Appl. No.: 08/986,667

[22] Filed: Dec. 8, 1997

[51] Int. Cl.[6] .............................. H01L 21/31; H01L 21/44
[52] U.S. Cl. ...................... 438/766; 438/659; 438/528; 438/622
[58] Field of Search .................................. 438/659, 658, 438/761, 762, 764, 765, 766, 778, 791, 528, 622

[56] References Cited

U.S. PATENT DOCUMENTS

| | | | |
|---|---|---|---|
| 4,704,302 | 11/1987 | Bruel et al. | 438/585 |
| 4,897,368 | 1/1990 | Kobushi et al. | 437/200 |
| 4,968,636 | 11/1990 | Sugawara | 438/423 |
| 5,182,226 | 1/1993 | Jang | 438/297 |
| 5,330,920 | 7/1994 | Soleimani et al. | 438/762 |
| 5,496,747 | 3/1996 | Hong | 437/35 |
| 5,648,287 | 7/1997 | Tsai et al. | 437/44 |

OTHER PUBLICATIONS

Liu et al., "Light Nitrogen Implant for Preparing Thin–Gate Oxides", IEEE Electron Device Letters, vol. 18, No. 3, Mar. 1997, pp. 105–107.

Yang et al., "Improved Electrical Characteristics of Thin–Film Transistors Fabricated on Nitrogen Implanted Polysilicon Films", IEDM, pp. 505–508, Jan. 1994.

Kuroi et al. "Highly Reliable 0.15 Micron Mosfets with Surface Proximity Gettering (SPG) And Nitrided Oxide Spacer Using Nitrogen Implantation", 1995 Symposium on VLSI Technology Digest, p. 19–20.

*Primary Examiner*—Michael Trinh
*Attorney, Agent, or Firm*—George O. Saile; Stephen B. Ackerman

[57] ABSTRACT

Making low resistance contact between two silicon layers has been accomplished by implanting nitrogen ions into a freshly formed silicon surface thereby forming a nitrogen rich layer at the surface which suppresses formation of a surface layer of oxide, the normal 20–30 Angstrom thick native oxide being now restricted to 3 or 4 Angstroms. When a layer of polysilicon is deposited onto this nitrided surface good, low resistance electrical contact is made. The process is fully compatible with existing methods for the manufacture of integrated circuits. An example of its application to making low resistance contact to a FET gate electrode is given.

16 Claims, 3 Drawing Sheets

REDUCTION OF POLYSILICON CONTACT RESISTANCE BY NITROGEN IMPLANTATION

BACKGROUND OF THE INVENTION (1) Field of the Invention

The invention relates to the general field of thin film deposition with particular reference to contact resistance between films.

(2) Description of the Prior Art

As a member of the general class of materials known as valve metals, a freshly formed silicon surface will rapidly develop a layer of native oxide when exposed to a source of oxygen. The growth of such a layer is self limiting, terminating at about 25 Angstroms for silicon at room temperature.

In the course of manufacturing silicon integrated circuits, electrical contact needs to be made to various silicon surfaces, some being part of the original single crystal body and some being deposited polysilicon layers. It is, in general, not cost effective to maintain such surfaces in an oxygen free environment from the time that they are first formed until the contacting layer is in place. The latter is, most commonly, itself a layer of polysilicon.

Until recently, the presence of a layer of native oxide between the two silicon layers has not presented a serious problem because the area over which contact was made was large enough that the added series resistance of the native oxide layer was negligible and/or subsequent heat treatments required by the ongoing manufacturing process caused the layer to be short circuited. For example, phosphorus atoms, present in the polysilicon as a dopant, will, when heated to temperatures in excess of about 800° C., break through the native oxide and reduce its resistance substantially.

With silicon processing now entering the so-called deep sub-micron era, both the above mechanisms (for neutralizing the effects of native oxide on contact resistance) are no longer present. The width of holes through which contact between the layers is to be made is now often less than about 0.35 microns and temperatures above 800° C. are no longer used in process steps that follow deposition of the second layer.

The prior art does not appear to have addressed this problem yet. We note that Kuroi et al. in "Highly reliable 0.15 micron MOSFETs with surface proximity gettering (SPG) and nitrided oxide spacer using nitrogen implantation" in the 1995 Symposium on VLSI Technology Digest, pp. 19–20, describe how hot carrier degradation in MOSFETs can be suppressed by implanting nitrogen ions into the source and drain regions.

Tsai et al. (U.S. Pat. No. 5,648,287 July 1997) use nitrogen ion implantation as a self-aligning method to form oxidation barriers that are limited to the horizontal surfaces of an amorphous silicon layer used to coat an FET gate electrode. The amorphous silicon is then selectively oxidized on its vertical surfaces, thereby forming a secondary set of spacers for the gate.

Kobushi et al. (U.S. Pat. No. 4,897,368 January 1990) teach the use of an ultra-thin layer of silicon nitride, formed by nitrogen ion implantation, for the purpose of limiting grain boundary diffusion through a polycrystalline film.

SUMMARY OF THE INVENTION

It has been an object of the present invention to provide a method for making low resistance contact between two layers of silicon.

A further object of the invention is that one of said layers be monocrystalline and the other polycrystalline.

A still further object of the invention is that both of said layers be polycrystalline.

Another object of the invention is that said method be fully compatible with existing processes for manufacturing integrated circuits.

These objects have been achieved by implanting nitrogen ions into a freshly formed silicon surface thereby forming a nitrogen rich layer at the surface which suppresses formation of a surface layer of oxide, the normal 20–30 Angstrom thick native oxide being now restricted to 3 or 4 Angstroms. When a layer of polysilicon is deposited onto this nitrided surface good, low resistance electrical contact is made. The process is fully compatible with existing methods for the manufacture of integrated circuits. An example of its application to making low resistance contact to a FET gate electrode is given.

DESCRIPTION OF THE PREFERRED EMBODIMENTS

Figure 1:
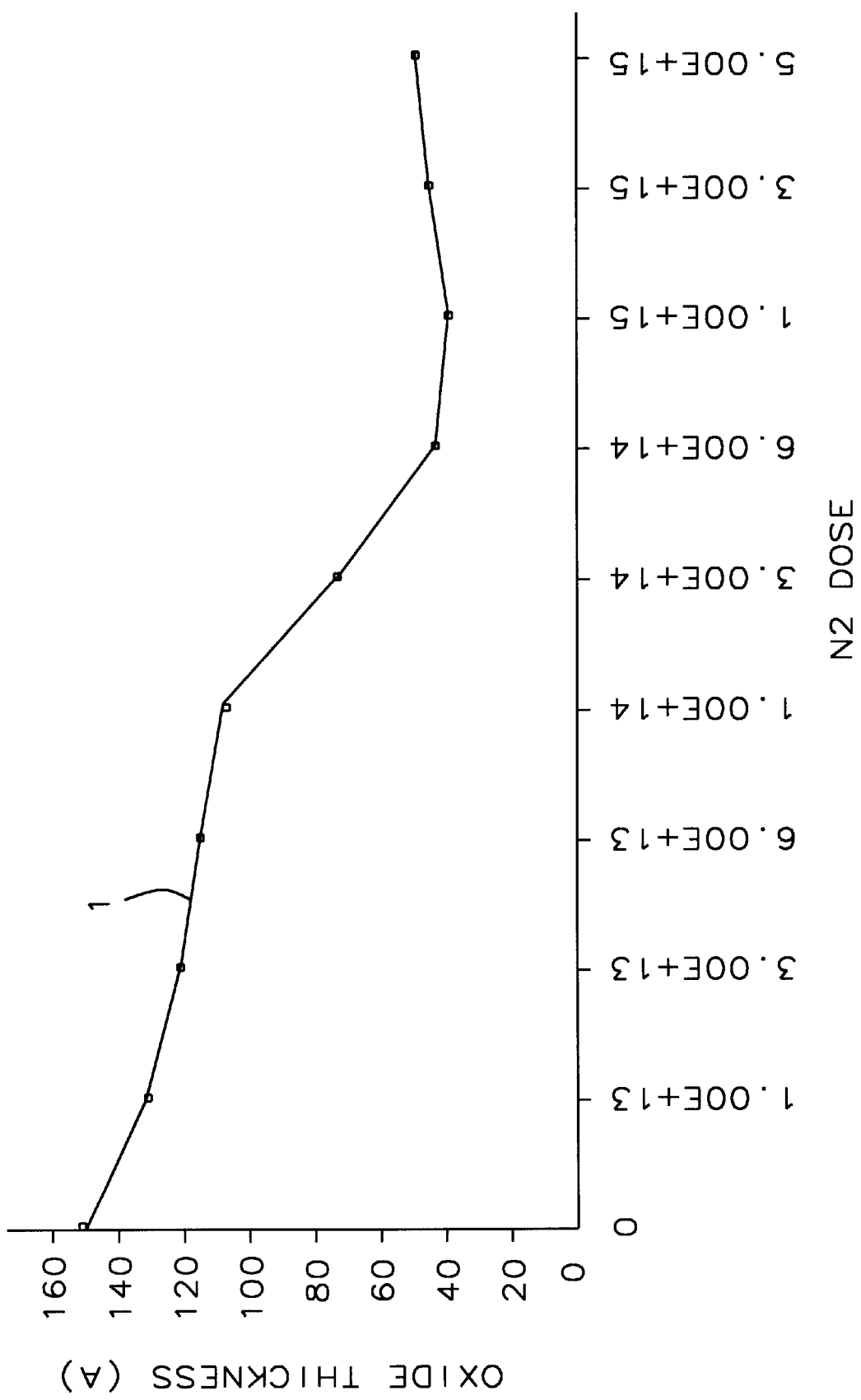
FIG. 1 is a curve of thickness vs. implanted nitrogen dosage for a silicon surface.

The present invention is based on our observation that formation of a native oxide layer, as discussed above, is greatly suppressed in silicon that is heavily doped with nitrogen. In FIG. 1 we show the results of an experiment which we performed where a freshly formed silicon surface was first subjected to various dosages of implanted nitrogen and then exposed to air at room temperature. Curve 1 is a plot of the thickness of the oxide layer grown at 900° C. in oxygen as a function of nitrogen dosage. As can be seen, in the absence of any nitrogen (normal silicon surface), the oxide layer was about 150 Angstroms thick. A significant drop in the thickness of the native oxide layer is apparent starting at dosages of about $3\times10^{14}$ per sq. cm. and leveling off at about 30 Angstroms for dosages greater than $6\times10^{14}$ per sq. cm.

The effect of the implanted nitrogen has been to suppress the formation of the native oxide layer by a factor of about 5. Thus, the thickness of the native oxide layer that is formed at room temperature would be expected to be reduced from its normal value of about 20 Angstroms to about 3 or 4 Angstroms, which amounts to a monomolecular layer of oxide. Even if such a thin layer could maintain its integrity, its electrical resistivity in the transverse direction would be very low because of tunneling effects.

The present invention is of a general nature in that it may be used for reducing contact resistance between any metallic layer deposited onto a silicon surface, between a layer of polysilicon deposited onto a body of single crystal silicon, or between a layer of polysilicon deposited onto a second, previously deposited, layer of polysilicon. We will illustrate the detailed application of the invention by describing a process for forming a self-aligned polysilicon contact in an integrated circuit.

Figure 2:
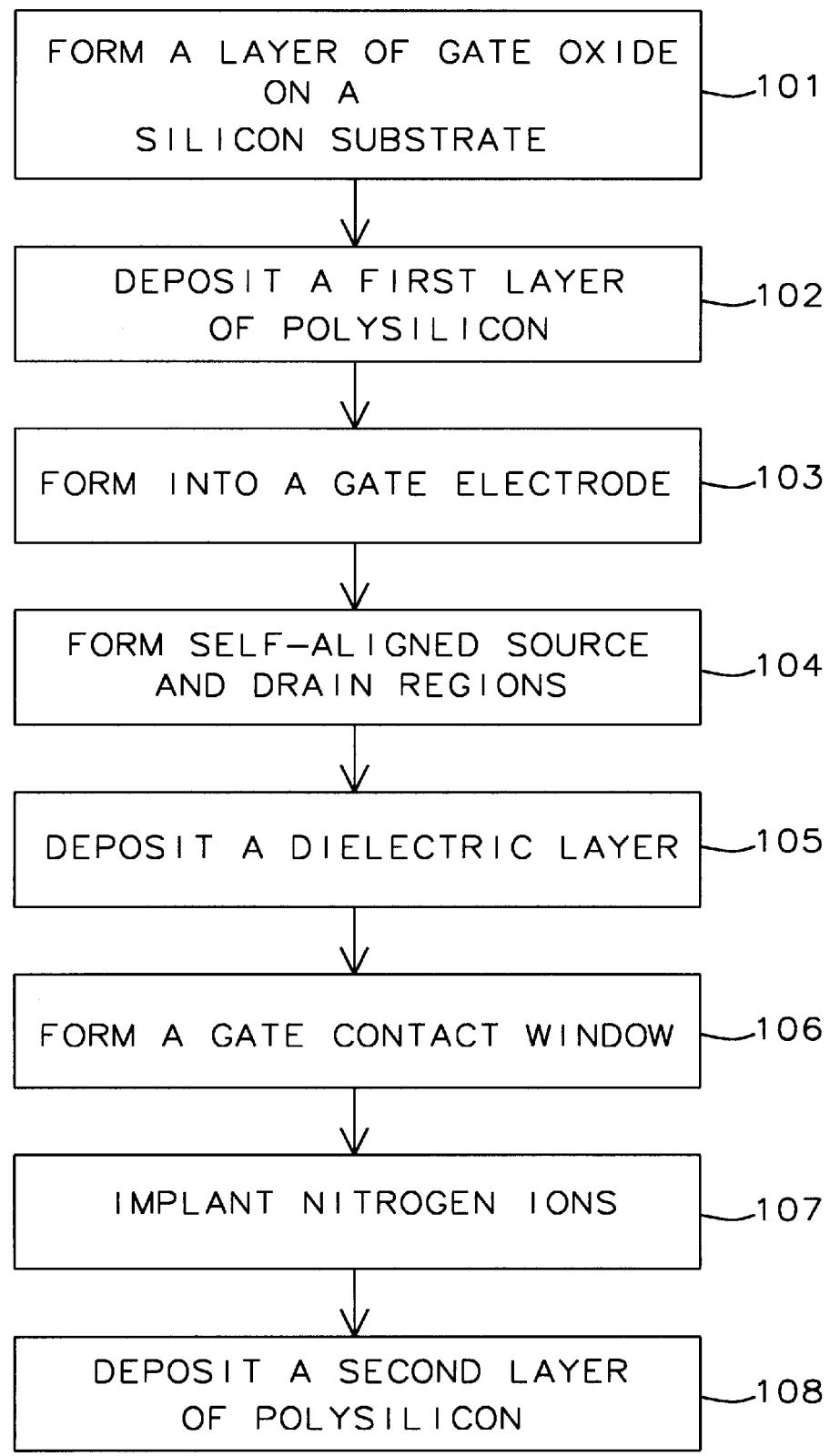
FIG. 2 is a flow chart illustrating a process taught by the present invention.

Referring now to FIG. 2, we show there a flow chart that provides an overview of the process. The process begins with a monocrystalline silicon substrate on whose surface a layer of gate oxide is formed (101). A first layer of polysilicon is then deposited over this layer of gate oxide (102) and patterned and etched to give it the shape of a gate electrode (103). Source and drain regions adjacent to this gate electrode are then formed (through ion implantation of suitable dopant species) using the gate electrode as its own mask (104).

This is followed by the deposition of a dielectric layer over the entire surface (105) and the formation of a gate contact window in it (106). As discussed earlier, this window has a width of between about 0.2 and 0.6 microns. This exposes a fresh surface of the first polysilicon layer. Before the latter is exposed to air, nitrogen ions are implanted into it (107). Our preferred acceleration voltage for the ions has been about 50 kV, but any acceleration voltage between about 20 and 100 kV would still be satisfactory. Typical nitrogen ion dosage has been about $10^{15}$ per sq. cm. but any dosage between about $8 \times 10^{14}$ and $10^{16}$ per sq. cm. could have been used without materially affecting the outcome. The thickness of the implanted nitrogen layer is between about 50 and 500 Angstroms.

With formation of the native oxide layer thus suppressed, a second layer of polysilicon is then deposited in the contact hole (as well as on the dielectric layer), making good electrical contact to the first polysilicon layer (108).

Figure 3:
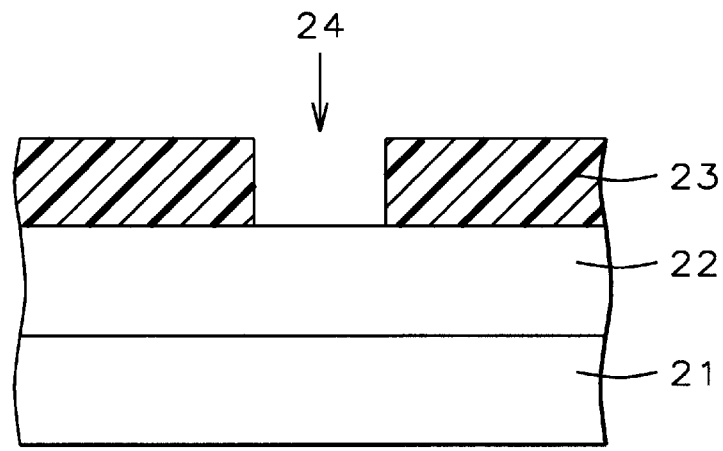
FIG. 3 shows a silicon body covered by a dielectric in which a contact window is to be etched.

In FIG. 3 we show a more detailed view of a part of the general process described above. Layer 21 which could be monocrystalline or polycrystalline silicon, depending on the application, is seen to be covered by dielectric layer 22. Layer 22 is typically silicon oxide deposited by LPCVD to a thickness between about 1,000 and 5,000 Angstroms, but other dielectric materials such as silicon nitride could also have been used. On layer 22 is photoresist layer 23 which has been patterned to determine the shape of future contact hole 24.

Figure 4:
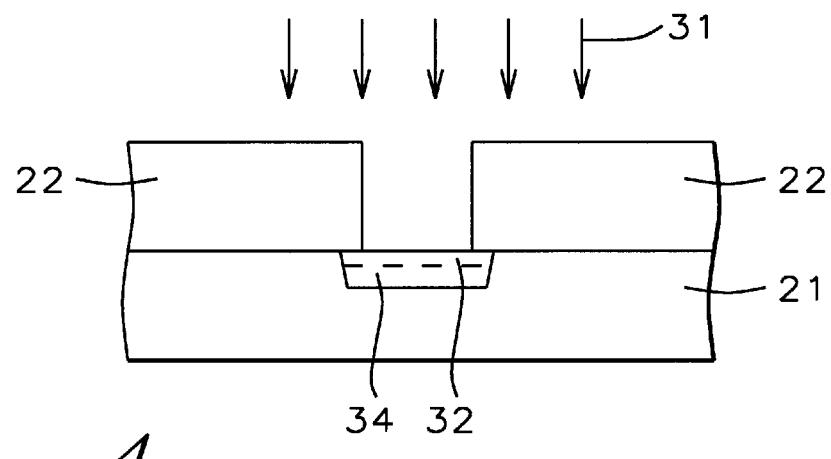
FIG. 4 shows the implantation of nitrogen ions into the silicon surface to which low resistance contact is to be made.

FIG. 4 shows dielectric layer 22 after the contact hole defined by 24 in FIG. 2 has been formed by etching using a fluorine or chlorine based etchant. An optional low resistivity region 34 is shown in the surface of 21 at the bottom of the contact hole. Nitrogen ions, shown symbolically by arrows 31, bombard the structure and are implanted in the bottom of the contact hole to form nitrogen rich layer 32.

Figure 5:
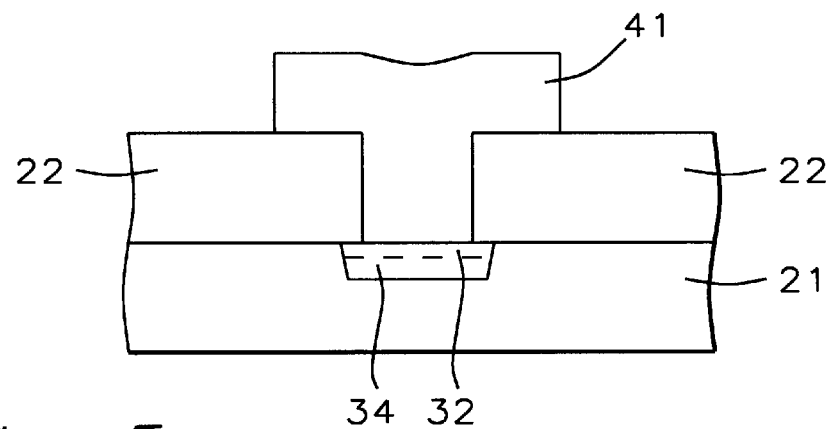
FIG. 5 shows the structure of FIG. 4 after a second layer of polysilicon has been deposited into the contact hole.

FIG. 5 shows the structure of FIG. 4 after a second polysilicon layer 41 has been deposited in the contact hole, making low resistance contact to 21. As shown, 41 has itself been patterned to form wiring that runs perpendicular to the plane of the figure. Any of several possible methods, including chemical vapor deposition and physical vapor deposition, could have been used for laying down layer 41.

While the invention has been particularly shown and described with reference to the preferred embodiments thereof, it will be understood by those skilled in the art that various changes in form and details may be made without departing from the spirit and scope of the invention.

What is claimed is:

1. A method for reducing polysilicon contact resistance, comprising the steps of:
   providing a body of single crystal silicon having a surface;
   removing an amount of said surface, thereby exposing a fresh surface;
   before said fresh surface is exposed to air, implanting nitrogen ions, at a voltage and at a dosage, in said fresh surface to a depth; and
   depositing a layer of polysilicon on said implanted surface whereby contact resistance between the layer of polysilicon and said implanted surface is reduced.

2. The method of claim 1 wherein said voltage is between about 20 and 100 kV.

3. The method of claim 1 wherein said dosage is between about $8 \times 10^{14}$ and $10^{16}$/sq. cm.

4. The method of claim 1 wherein said depth is between about 50 and 500 Angstroms.

5. The method of claim 1 wherein the step of depositing a layer of polysilicon further comprises chemical vapor deposition or physical vapor deposition.

6. A method for reducing polysilicon contact resistance, comprising the steps of:
   providing a first layer of polysilicon, having a surface, on a substrate;
   removing an amount of said surface, thereby exposing a fresh surface;
   before said fresh surface is exposed to air, implanting nitrogen ions, at a voltage and at a dosage, in said fresh surface to a depth; and
   depositing a second layer of polysilicon on said implanted surface whereby contact resistance between the layer of polysilicon and said implanted surface is reduced.

7. The method of claim 6 wherein said voltage is between about 20 and 100 kV.

8. The method of claim 6 wherein said dosage is between about $8 \times 10^{14}$ and $10^{16}$/sq. cm.

9. The method of claim 6 wherein said depth is between about 50 and 500 Angstroms.

10. The method of claim 6 wherein the step of depositing a second layer of polysilicon further comprises chemical vapor deposition or physical vapor deposition.

11. A process for forming a self-aligned polysilicon contact in an integrated circuit, comprising the steps of:
    providing a silicon body;
    forming a layer of gate oxide on said silicon body;
    depositing a first layer of polysilicon on the layer of gate oxide;
    patterning and etching said first layer of polysilicon and layer of gate oxide to form a gate electrode;
    forming self-aligned source and drain regions adjacent to the gate electrode;
    depositing a dielectric layer over the gate and the source and drain regions;
    patterning and etching the dielectric layer to form a gate contact window, having a width, thereby exposing a fresh gate surface;
    before said fresh gate surface is exposed to air, implanting nitrogen ions, at a voltage and at a dosage, in said fresh gate surface to a depth; and
    depositing a second layer of polysilicon on said dielectric layer and on said implanted gate surface whereby contact resistance between the layer of polysilicon and said implanted surface is reduced.

12. The method of claim 11 wherein said voltage is between about 20 and 100 kV.

13. The method of claim 11 wherein said dosage is between about $8 \times 10^{14}$ and $10^{16}$/sq. cm.

14. The method of claim 11 wherein said depth is between about 50 and 500 Angstroms.

15. The method of claim 11 wherein the contact window width is between about 0.2 and 0.6 microns.

16. The method of claim 11 wherein said dielectric layer is deposited to a thickness between about 1,000 and 5,000 Angstroms.

* * * * *